(12) United States Patent
Bhowmik et al.

(10) Patent No.: US 7,368,012 B2
(45) Date of Patent: May 6, 2008

(54) METHODS AND APPARATUSES FOR A DYNAMIC GROWING OF SINGLE-CRYSTAL THIN-FILM COMPOSED OF ORGANIC MATERIALS

(75) Inventors: Achintya K. Bhowmik, Milpitas, CA (US); Shida Tan, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 389 days.

(21) Appl. No.: 10/975,565

(22) Filed: Oct. 27, 2004

(65) Prior Publication Data
US 2006/0086312 A1    Apr. 27, 2006

(51) Int. Cl.
*C30B 29/54* (2006.01)
(52) U.S. Cl. .................. 117/68; 117/69; 117/927; 422/245.1
(58) Field of Classification Search .......... 422/245.1; 117/68, 69, 927
See application file for complete search history.

(56) References Cited

U.S. PATENT DOCUMENTS

| 5,738,720 | A  | * | 4/1998 | Shimada et al. ............... 117/94 |
| 6,879,743 | B2 |   | 4/2005 | Bhowmik et al. |
| 7,014,705 | B2 | * | 3/2006 | David .......................... 117/68 |
| 7,052,545 | B2 | * | 5/2006 | Quake et al. .................. 117/68 |
| 2005/0218793 | A1 | | 10/2005 | Bhowmik et al. |

* cited by examiner

*Primary Examiner*—Robert Kunemund
(74) *Attorney, Agent, or Firm*—Blakely, Sokoloff, Taylor & Zafman LLP

(57) ABSTRACT

A method, apparatus, and system are described to generate a single-crystal film formed of an organic material in a microstructure chamber having a growth zone with defined dimensions. A flow of at least one of a 1) saturated solution of organic crystalline molecules or 2) molten organic crystalline molecules may be controlled to the growth zone to achieve a balance between crystal-film growth and the flow of the at least one of 1) additional saturated solution of organic crystalline molecules or 2) additional molten organic crystalline molecules into the growth zone.

17 Claims, 4 Drawing Sheets

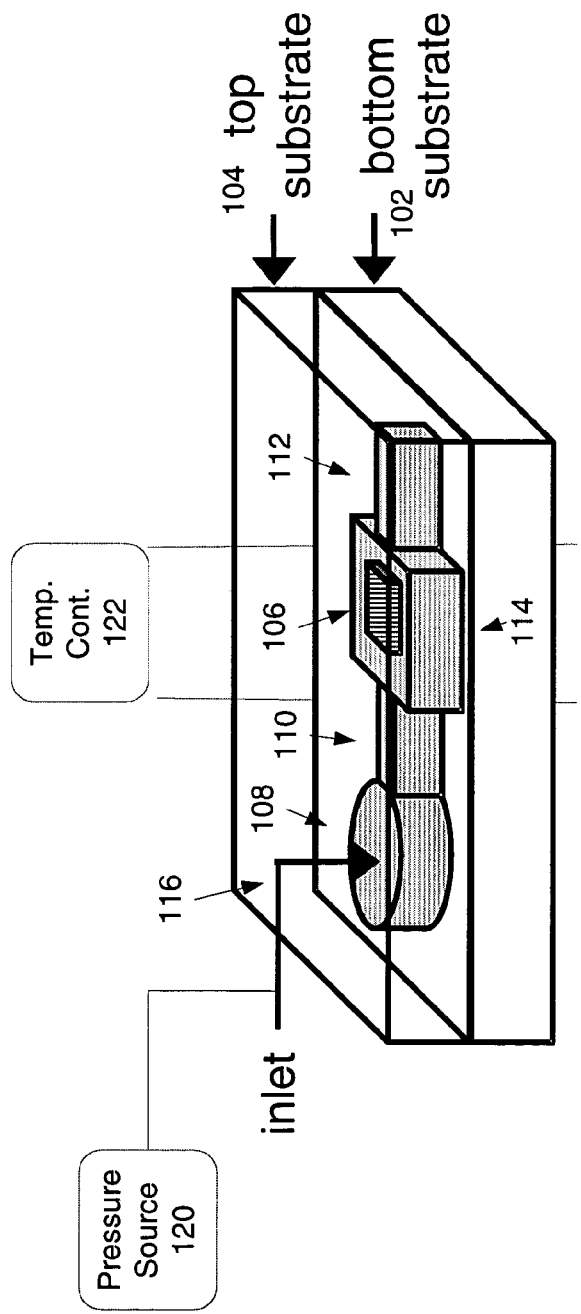
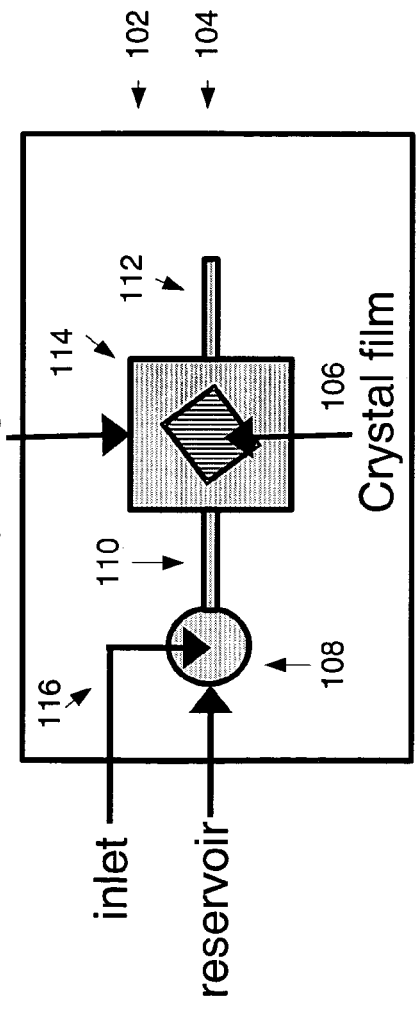
Figure 1a
Figure 1b

```
                    ┌──────┐
                    │ Cont.│
                    └──────┘
                        │
                        ▼
```

| Controlling a flow rate of the at least one of 1) saturated solution of organic crystalline molecules or 2) molten organic crystalline molecules to the growth zone based on the design and dimensions of micro-channels coupled to the growth zone.<br>312 |
|---|

| Controlling an organic-crystal orientation of a resultant single-crystal film to have a predetermined crystallographic orientation based upon a seed crystal starting with the desired predetermined crystallographic orientation.<br>314 |
|---|

| Controlling an organic-crystal orientation of a resultant single-crystal film to have a predetermined crystallographic orientation based upon E-fields of a Direct Current voltage source aligned to generate the predetermined crystallographic orientation.<br>316 |
|---|

| Stopping the flow of the at least one of 1) additional saturated solution of organic crystalline molecules or 2) additional molten organic crystalline molecules to the single-crystal film formed of organic material when the growth of the single-crystal film stops the flow.<br>318 |
|---|

| Generating a resultant single-crystal film formed of an organic material in a microstructure chamber having a growth zone with defined height, width, and thickness dimensions which are integrated into one or more substrates. The resulting single-crystal film 206 may have, for example, length and width dimensions between 0.5 inches and 1.5 inches along with a thickness of less than twenty micrometers.<br>320 |
|---|

Figure 3b        ( End )

METHODS AND APPARATUSES FOR A DYNAMIC GROWING OF SINGLE-CRYSTAL THIN-FILM COMPOSED OF ORGANIC MATERIALS

FIELD

Aspects of embodiments of the invention may relate to the field of producing a single-crystal thin film of organic material.

BACKGROUND

Several techniques have been used to generate single-crystals from organic materials.

For example in one technique, an initial amount of powdered SiliconCarbide (SiC) single-crystal source material may be placed inside a crucible. A heating process thermally sublimates the powdered SiC source material. The molten SiC source material is allowed to re-crystallize to grow a single-crystal of SiC material.

Another technique to produce an organic compound single-crystal film may be laying two smooth substrates on each other with spacers. The substrates are then immersed in a solution of an organic compound. Solvent from the solution is slowly evaporated to make the organic compound crystal grow between the substrates.

However, in both cases above, the resulting single-crystal film is generally composed of several fragments of polycrystalline structure measuring, for example, several microns square. The fragments may not be repeatably large in size and or repeatable in the same shape. The single-crystal film growth techniques above may yield single-crystal films with a relatively small area mainly because the initial organic compound is introduced and then left alone. A mechanism does not typically exist to add more organic material to the initial organic material. After the initial source material is introduced, 1) the solvent is allowed to evaporate or 2) the organic compound melt is allowed to re-crystallize and subsequently forms a small fragmented crystalline film.

BRIEF DESCRIPTION OF THE DRAWINGS

The drawings refer to embodiments of the invention in which:

FIG. 1a illustrates a 3-dimensional view of an embodiment of one or more substrates to produce a single-crystal film of an organic compound from 1) a molten liquid of crystalline molecules or 2) a saturated solution of the organic compound.

FIG. 1b illustrates a top down view of an embodiment of the one or more substrates to produce the single-crystal film of an organic compound from 1) a molten liquid of crystalline molecules or 2) a saturated solution of the organic compound.

FIGS. 3a and 3b illustrate a flow diagram of an embodiment of a process flow to produce a single-crystal film of an organic compound from either 1) a molten liquid of crystalline molecules or 2) a saturated solution of the organic compound.

Figure 2:
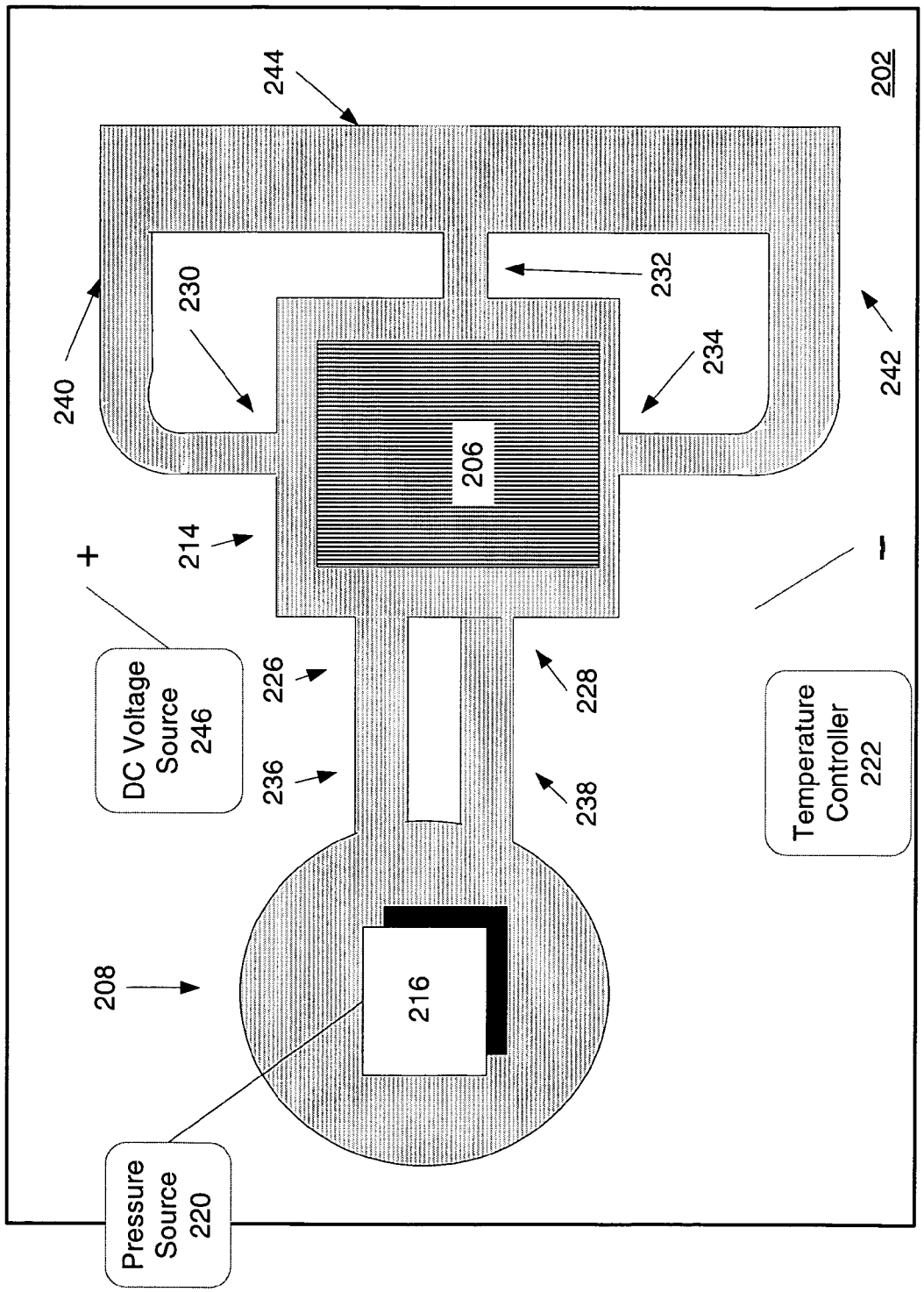
FIG. 2 illustrates a top down view of an embodiment of a substrate having a microstructure chamber constructed with two or more inlet ports and two or more outlet ports to prevent premature stoppage of the flow due to plugging rather than crystal growth.

While the invention is subject to various modifications and alternative forms, specific embodiments thereof have been shown by way of example in the drawings and will herein be described in detail. The embodiments of the invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific named components, connections, etc., in order to provide a thorough understanding of the embodiments of the invention. It will be apparent, however, to one of ordinary skill in the art that the embodiments of the invention may be practiced without these specific details. The specific details may be varied from and still be contemplated to be within the spirit and scope of the present invention.

In general, various methods, apparatuses, and systems are described to dynamically produce a single-crystal thin film composed of a functional organic compound on a substrate or between a pair of substrates. A flow of either 1) saturated solution of organic crystalline molecules or 2) molten organic crystalline molecules may be maintained into a growth zone integrated into the substrates to grow the size of the single-crystal film. The single-crystal film may be grown with a uniform molecular orientation and controlled dimensions. The resulting single-crystal films may be repeatably greater than one inch squared.

FIG. 1 illustrates a 3-dimensional view of an embodiment of one or more substrates to produce a single-crystal film of an organic compound from 1) a molten liquid of crystalline molecules or 2) a saturated solution of the organic compound. FIG. 1b illustrates a top down view of an embodiment of the one or more substrates to produce the single-crystal film of an organic compound from 1) a molten liquid of crystalline molecules or 2) a saturated solution of the organic compound. The bottom substrate 102, top substrate 104, or parts of both substrates 102, 104 have various three-dimensional geometrical structures created in the substrates via a micro-fluidic technique. The various three-dimensional geometrical structures are capable of controlling the dimensions of the growth of the single-crystal film of the organic compound 106 on or in between the substrates 102, 104.

The bottom substrate 102, top substrate 104, or parts of both substrates 102, 104 form various microstructures etched within the substrates 102, 104. The various microstructures formed may be, for example, an input solution reservoir 108, one or more micro-fluidic channels 110, 112, and a microstructure chamber 114 having a growth zone, and a fill micro-fluidic channel 116 to add fresh molten crystalline molecules or saturated solution. The dimensions of the microstructure chamber 114 having a growth zone with defined height, width, and thickness dimensions may be integrated into a planar surface of one or more of the substrates 102, 104. The etching can be performed via a number of micro-fluidic fabrication techniques. The dimensions of the growth zone formed within the substrates can define the dimensions of the single-crystal film 106.

The micro-fluidic fabrication techniques may generate microstructures 108-116 where at least one of the dimensions of the microstructure is less than twenty micrometers in the planar surface of the one or more substrates 102, 104. The generated three-dimensional geometrical structures 108-116 in the substrates 102, 104, such as a silicon wafer, may control both the dimensions of the growth of the organic single-crystal film 106 and the flow rate of 1) additional saturated solution of organic crystalline molecules or 2) additional molten organic crystalline molecules to the single-crystal film 106 formed in the microstructure chamber 114.

The single-crystal film 106 may be formed of an organic material, such as a non-linear second order electro-optic material, a third order organic material, or similar type of organic material.

The initial deposited single-crystal material in the growth zone may be subsequently grown to a single-crystal film 106 with the addition of more organic crystal material.

A saturated solution of organic crystalline molecules may be generated by a bulk crystalline organic material or a powered crystalline organic material dissolved in a solvent to achieve a saturation state where the solvent cannot dissolve anymore crystalline organic material.

The saturated solution of organic crystalline molecules may be added to the input reservoir 108 through a micro-fluidic channel 116 opening in the top substrate 104. The process starts off with an initial amount of organic crystalline compound and then in a controlled manner adds more crystal molecules to grow the size of the single-crystal film 106. The growth zone in the microstructure chamber 114 fills up with the saturated solution of organic crystalline molecules and begins to form the single-crystal film 106 as the solvent evaporates. The initial stages of the single-crystal film 106 are formed by slowly evaporating the solvent of the saturated solution on the substrate or between the pair of substrates 102, 104.

The one or more micro-fluidic channels 110, 112 in the substrates 102, 104 control a flow rate of additional saturated solution of organic crystalline molecules to the growth zone. The flow rate of additional saturated solution of organic crystalline molecules is controlled to achieve a balance between crystal-film growth and evaporation of the solvent.

Thus, the addition of saturated solution of organic crystalline molecules into the growth zone is balanced with the solvent evaporation rate. The evaporation rate of a particular solvent and corresponding crystal growth can be looked up in a reference chart or determined by experimentation.

The flow of the additional saturated solution of organic crystalline molecules to the growth zone may stop when the physical growth of the single-crystal film 106 stops the flow. The single-crystal film 106 will have grown to approximately the dimensions of the growth zone in the microstructure chamber 114.

Additional ways to control the flow rate of organic material, different types of organic material, the orientation of the molecules, and more will be discussed in more depth below.

Organic crystalline material generally includes crystalline molecules based upon carbon compounds as opposed to inorganic crystal compounds such as salt, Gallium-Arsenide, Silicon, etc. An example of an organic non-linear second order electro-optic material may be a stilbene-based organic molecular salt, such as 4'-dimethylamino-N-methyl-4-stilbazolium tosylate (DAST). DAST possesses extremely large electro-optic coefficients and exhibits controlled crystalline film growth on planar substrates 102, 104.

Molten organic crystalline molecules, also known as melt, may be used to add additional crystalline molecules rather then the saturated solution. The molten organic crystalline molecules may be generated by heating a solid crystalline organic material or a powered crystalline organic material to a melting temperature to make a liquid crystalline organic material.

The single-crystal film 106 of the organic compound can be formed by slowly cooling an initial amount of molten organic crystalline molecules fed on the one or more substrates 102, 104 in the microstructure chamber 114. For example, the substrate or the pair of substrates 102, 104 is uniformly slowly cooled or cooled from the end of the growth zone by withdrawing the substrate from a high temperature environment, at a rate capable of attaining crystal growth. As the initial molten organic crystalline molecules cool and crystallizes pockets of space will start appearing in the growth zone.

The addition of molten organic crystalline molecules may be balanced with the single-crystal-film growth due to a re-crystallization rate of the molten organic crystalline molecules. The re-crystallization rate of a particular molten organic crystalline molecule at a given temperature can be looked up in a reference chart or determined by experimentation.

The injection rate of either 1) the molten organic crystalline molecules or 2) the saturated solution can be controlled by a syringe pump or through gravity flow. Further, the flow rate of the saturated solution or the molten organic crystalline molecules may be controlled via the design of the micro-fluidic channels 110,112 to the crystal-film growth zone.

Similarly, the flow-speed of the saturated solution/molten organic crystalline molecules can be controlled via a flow design and dimensions of the micro-fluidic channels 110, 112 in cooperation with an amount of positive or suction pressure applied to the saturated solution/molten organic crystalline molecules.

A pressure source 120, such as compressed gas, cooperates with the micro-fluidic channels 110, 112 by applying a pressure above atmospheric pressure to the saturated solution of organic crystalline molecules. The more precise flow rate allows a finer balancing of the addition of the saturated solution of organic crystalline molecules with a growth of the single-crystal film 106 based upon a solvent evaporation rate.

Similarly, the pressure source 120 may cooperate with the micro-fluidic channels 110, 112 by applying a pressure above atmospheric pressure to the molten organic crystalline molecules. The more precise flow rate allows a finer balancing of the addition of the molten organic crystalline molecules. In addition, a temperature controller 122, such as a heater or a heating-cooling unit, cooperates with the flow rate to control a temperature of the growth zone to control a crystallization rate of the molten organic crystalline molecules.

The temperature of the molten organic crystalline molecules with the single-crystal film 106 in the growth zone may be maintained to keep the molten organic crystalline molecules in a semi-liquid form while allowing the solid single-crystal film 106 to grow. Further, as discussed above, portions of the growth zone may be cooled to accelerate the crystallization rate and then more hot molten organic crystalline molecules may then be added.

The stable crystal-film growth process may be sustainable through use of an optimized flow of organic crystalline material that balances the solvent evaporation rate due to the crystal-film growth and the introduction of fresh saturated solution into the growth zone.

Similarly, the stable crystal-film growth process may be sustainable through use of an optimized flow of organic crystalline material that balances re-crystallization of the molten organic crystalline molecules due to the crystal-film growth and the introduction of fresh molten organic crystalline molecules into the growth zone.

FIG. 2 illustrates a top down view of an embodiment of a substrate having a microstructure chamber constructed with two or more inlet ports and two or more outlet ports to prevent premature stoppage of the flow due to plugging rather then crystal growth. The substrate may have a microstructure chamber 214 constructed with two or more inlet ports 226, 228 and two or more outlet ports 230-234, an input solution reservoir 208, one or more micro-fluidic channels 236-242, and a microstructure chamber 214 having a growth zone, an output solution reservoir 244, and a fill micro-fluidic channel 216 to add fresh melt or saturated solution. Further, a Direct Current voltage source 246 may couple to the substrate. A pressure source 220 may supply positive compressed gas pressure to the fill micro-fluidic channel 216. The pressure source 220 may supply a suction pressure if connected to the output solution reservoir 244. A temperature controller 222 may control a temperature of the growth zone to control a crystallization rate of the molten organic crystalline molecules.

The molecular orientation of a resultant single-crystal film 206 may be controlled to have a predetermined crystallographic orientation.

A seed crystal may be placed in the growth zone prior to adding any melt or saturated solution. A microcrystal of the desired organic material with a desired crystallographic orientation may be placed in the growth zone as a seed crystal. Different organic materials produce different properties such as second order and third order nonlinear optical effects. Further, a crystal may have up to three different values for a refractive index of that organic material depending on the axis of the molecule orientation of the molecules in the crystal.

For example, a seed crystal may be formed as a slice from a bulk crystal with a known molecular orientation. A first slice of the bulk crystal may be cut along the X-axis to generate a seed crystal with a first crystallographic orientation, i.e. molecular orientation. A second slice of the bulk crystal may be cut along the Y-axis to generate a seed crystal with a second crystallographic orientation. A third slice of the bulk crystal may be cut along the Z-axis to generate a seed crystal with a third crystallographic orientation. Thus, the seed crystal may be created with all of the molecules in the crystal having specific molecule orientations.

The molecules of the seed crystal will have a predetermined organic-crystal orientation and will have formed bonds with all of the other neighboring molecules in the seed crystal. As new organic crystalline molecules are added to the growth zone, the molecules will tend to align with the existing molecular bonds. The neighboring crystal molecules join together in the course of their growth to grow into a large single-crystal film 206 extending over a wide area with its face paralleling the surface of a substrate 202. Each crystal segment of the single crystal film 206 growing on the substrate 102 may have a uniform molecular orientation.

A Direct Current voltage source 246 coupled to the substrate 202 may also be used to generate a desired predetermined organic-crystal orientation of the resultant single-crystal film 206. The E-fields of the Direct Current voltage source 246 may be aligned to generate the predetermined organic-crystal orientation of the resultant single-crystal film 206. The dipole axes of the organic crystal molecules will tend to align with the E-field direction.

Thus, an organic-crystal orientation of the resultant single-crystal film 206 may have desired predetermined crystallographic orientation due to 1) the seed crystal starting with the desired predetermined crystallographic orientation, 2) the E-fields of the DC voltage source aligned to generate the desired predetermined crystallographic orientation, or 3) some other similar technique. If a particular molecular orientation of the resultant single-crystal film 206 is not important, then a seed crystal or an exterior E-field source may not be used and a random molecular orientation will occur.

Note, the DC voltage source is shown positioned such that the E-field direction is parallel to the substrate. An another example positioning option could be the voltage may be applied along the thickness direction with the electrodes positioned below and above the crystal growth zone. This can yield a higher value of E-field for the same voltage.

The thickness of the single-crystal film 206 of organic material may be controlled through a combination of control of the crystal growth and the dimensions of the growth area. The resulting single-crystal film 206 may have length and width dimensions, for example, greater than 0.5 inches and a molecular orientation of the single-crystal film 206 that is aligned in a predetermined direction. For an embodiment, the resulting single-crystal film 206 may have length and width dimensions between 0.5 inches and 1.5 inches along with a thickness of less than twenty micrometers.

Thus, a single-crystal film 206 may be formed of an organic electro-optic material with appropriate principal axes orientation. The single-crystal film 206 may exhibit second order electro-optic effects.

The application of the micro-fluidics to the substrates offers the possibility of growing single-crystal thin films with pre-defined dimensions. The three dimensional structures may be designed to grow multiple arrays of single-crystal thin films. Once the growth parameters and patterns are optimized, the production of substrates with single-crystal films of organic material can be scaled up easily.

Figure 3A:
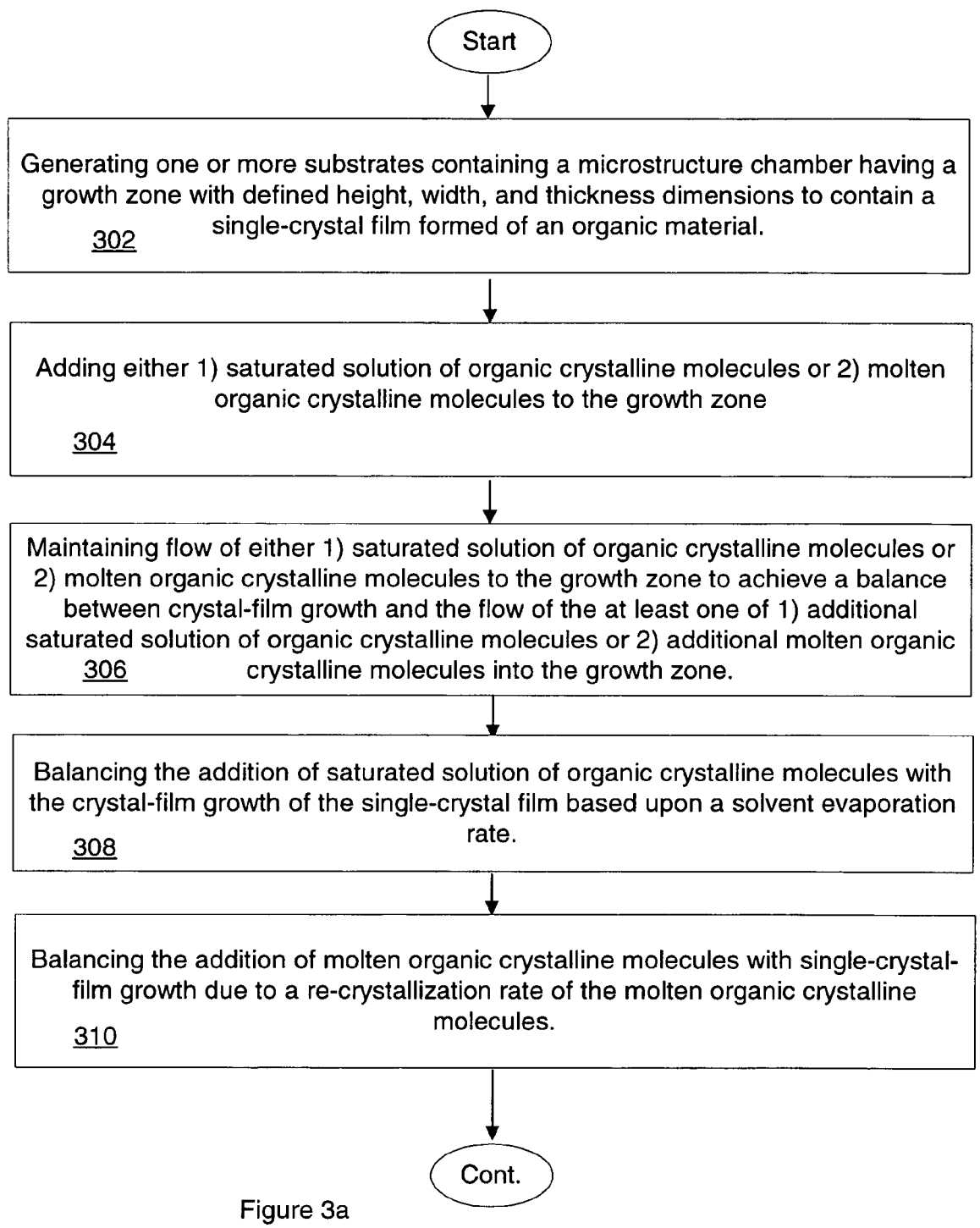

FIGS. 3a and 3b illustrate a flow diagram of an embodiment of a process flow to produce a single-crystal film of an organic compound from either 1) a molten liquid of crystalline molecules or 2) a saturated solution of the organic compound.

In block 302, one or more substrates containing a microstructure chamber having a growth zone with defined height, width, and thickness dimensions may be generated to contain a single-crystal film formed of an organic material.

In block 304, either a 1) saturated solution of organic crystalline molecules or 2) molten organic crystalline molecules may be added to the growth zone.

In block 306, the flow of either the 1) saturated solution of organic crystalline molecules or 2) molten organic crystalline molecules to the growth zone may be maintained to achieve a balance between crystal-film growth and the flow of the additional saturated solution of organic crystalline molecules or additional molten organic crystalline molecules into the growth zone.

In block 308, the addition of saturated solution of organic crystalline molecules may be balanced with the crystal-film growth of the single-crystal film based upon a solvent evaporation rate.

In block 310, the addition of molten organic crystalline molecules may be balanced with single-crystal-film growth due to a re-crystallization rate of the molten organic crystalline molecules.

In block 312, the flow rate of the either 1) a saturated solution of organic crystalline molecules or 2) molten organic crystalline molecules may be controlled to the growth zone based on the design and dimensions of micro-channels coupled to the growth zone. In addition, a regulated pressure source may give ever better control over the flow rate.

In block 314, the organic-crystal orientation of a resultant single-crystal film may be controlled to have a predetermined crystallographic orientation based upon a seed crystal starting with the desired predetermined crystallographic orientation.

In block 316, the organic-crystal orientation of a resultant single-crystal film may be controlled to have a predetermined crystallographic orientation based upon E-fields of a Direct Current voltage source aligned to generate the predetermined crystallographic orientation.

In block 318, the flow of either the 1) additional saturated solution of organic crystalline molecules or 2) additional molten organic crystalline molecules to the single-crystal film formed of organic material may be stopped when the growth of the single-crystal film stops the flow.

In block 320, the resultant single-crystal film formed of an organic material may be generated in a microstructure chamber having a growth zone with defined height, width, and thickness dimensions which are integrated into one or more substrates.

While some specific embodiments of the invention have been shown the invention is not to be limited to these embodiments. For example, the substrate may also be made of fused quartz, glass having a high refractive index, etc. Other techniques besides use of saturated solutions or molten compounds may be used. The drawings are not drawn to scale but merely for illustrative purposes. The invention is to be understood as not limited by the specific embodiments described herein, but only by scope of the appended claims.

What is claimed is:

1. A method, comprising:
   generating a single-crystal film formed of an organic material in a microstructure chamber having a growth zone with defined height, width, and thickness dimensions which are integrated into one or more substrates;
   maintaining flow of at least one of a 1) saturated solution of organic crystalline molecules or 2) molten organic crystalline molecules to the growth zone to achieve a balance between crystal-film growth and the flow of the at least one of 1) additional saturated solution of organic crystalline molecules or 2) additional molten organic crystalline molecules into the growth zone;
   balancing the addition of at least one of 1) the saturated solution of organic crystalline molecules with the crystal-film growth of the single-crystal film based on a solvent evaporation rate or 2) the molten organic crystalline molecules with the crystal-film growth of the single-crystal film due to a re-crystallization rate of the molten organic crystalline molecules; and
   controlling an organic-crystal orientation of a resultant single-crystal film to have a predetermined crystallographic orientation based upon E-fields of a Direct Current voltage source aligned to generate the predetermined crystallographic orientation.

2. The method of claim 1, further comprising:
   stopping the flow of the at least one of 1) additional saturated solution of organic crystalline molecules or 2) additional molten organic crystalline molecules to the single-crystal film formed of organic material when the growth of the single-crystal film stops the flow.

3. The method of claim 1, further comprising:
   controlling a flow rate of the at least one of 1) saturated solution of organic crystalline molecules or 2) molten organic crystalline molecules to the growth zone based on the design and dimensions of micro-channels coupled to the growth zone.

4. The method of claim 1, further comprising:
   controlling an organic-crystal orientation of a resultant single-crystal film to have a predetermined crystallographic orientation based upon a seed crystal starting with the predetermined crystallographic orientation.

5. The method of claim 1, wherein a resulting single-crystal film has at least two dimensions greater than 0.5 inches and a molecular orientation of the single-crystal film is aligned in a predetermined direction.

6. An apparatus, comprising:
   one or more substrates containing a microstructure chamber having a growth zone with defined height, width, and thickness dimensions to contain a single-crystal film formed of an organic material;
   means for maintaining flow of at least one of a 1) saturated solution of organic crystalline molecules or 2) molten organic crystalline molecules to the growth zone to achieve a balance between crystal-film growth and the flow of the at least one of 1) additional saturated solution of organic crystalline molecules or 2) additional molten organic crystalline molecules into the growth zone;
   at least one of 1) means for balancing the addition of saturated solution of organic crystalline molecules with the crystal-film growth of the single-crystal film based upon a solvent evaporation rate and 2) means for balancing the addition of molten organic crystalline molecules with single-crystal-film growth due to a re-crystallization rate of the molten organic crystalline molecules; and
   means for controlling an organic-crystal orientation of a resultant single-crystal film to have a predetermined crystallographic orientation based upon E-fields of a Direct Current voltage source aligned to generate the predetermined crystallographic orientation.

7. An apparatus, comprising:
   one or more substrates containing a microstructure chamber having a growth zone with defined dimensions integrated into the substrates to contain a single-crystal film formed of an organic material; and
   one or more micro-fluidic channels in the substrates to control a flow rate of at least one of 1) a saturated solution of organic crystalline molecules or 2) molten organic crystalline molecules to the growth zone to achieve a balance between crystal-film growth and the flow rate of the at least one of 1) additional saturated solution of organic crystalline molecules or 2) additional molten organic crystalline molecules into the growth zone; wherein a resultant single-crystal film has at least two dimensions greater than 0.75 inches and a molecular orientation of the single-crystal film is aligned in a predetermined direction.

8. The apparatus of claim 7, further comprising:
   a first micro-fluidic channel having at least one dimension measuring less than twenty micrometers, wherein the first micro-fluidic channel is to supply the at least one of 1) additional saturated solution of organic crystalline molecules or 2) additional molten organic crystalline molecules.

9. The apparatus of claim 7, further comprising:
a seed crystal having a predetermined organic-crystal orientation located in the growth zone to generate the predetermined organic-crystal orientation of a resultant single-crystal film.

10. The apparatus of claim 7, further comprising:
a pressure source to cooperate with the micro-fluidic channels by applying a pressure above atmospheric pressure to the saturated solution of organic crystalline molecules to control the addition of the saturated solution of organic crystalline molecules with a growth of the single-crystal film based upon a solvent evaporation rate.

11. The apparatus of claim 7, further comprising:
a pressure source to cooperate with the micro-fluidic channels by applying a pressure above atmospheric pressure to the molten organic crystalline molecules to control the addition of the molten organic crystalline molecules; and
a temperature controller to control a temperature of the growth zone to control a crystallization rate of the molten organic crystalline molecules.

12. The apparatus of claim 7, wherein the microstructure chamber is constructed with three or more ports.

13. The apparatus of claim 7, wherein the organic material is an organic non-linear second order electro-optic material.

14. A system, comprising:
one or more substrates containing a microstructure chamber having a growth zone with a defined thickness dimension integrated into the substrates to contain a single-crystal film formed of an organic material;
one or more micro-fluidic channels in the substrates to control a flow rate of at least one of 1) a saturated solution of organic crystalline molecules or 2) molten organic crystalline molecules to the growth zone to achieve a balance between crystal-film growth and the flow rate of the at least one of 1) additional saturated solution of organic crystalline molecules or 2) additional molten organic crystalline molecules into the growth zone; and
a pressure source to cooperate with the micro-fluidic channels by applying a pressure above atmospheric pressure to the saturated solution or the molten organic crystalline molecules to control the flow rate of the additional saturated solution or the molten organic crystalline molecules.

15. The system of claim 14, further comprising:
a Direct Current voltage source coupled to the substrates, wherein E fields of the Direct Current voltage source are aligned to generate an organic-crystal orientation of a resultant single-crystal film.

16. The system of claim 14, further comprising:
a temperature controller to control a temperature of the growth zone to control a crystallization rate of the molten organic crystalline molecules.

17. The system of claim 14, wherein a resultant single-crystal film has at least two dimensions greater than 0.75 inches.

* * * * *